(12) United States Patent
Shimamura et al.

(10) Patent No.: US 9,402,321 B2
(45) Date of Patent: Jul. 26, 2016

(54) SOLDERING METHOD USING A LOW-TEMPERATURE SOLDER PASTE

(71) Applicant: SENJU METAL INDUSTRY CO, LTD., Tokyo (JP)

(72) Inventors: Masato Shimamura, Tokyo (JP); Ken Tachibana, Tokyo (JP); Takayuki Hori, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 143 days.

(21) Appl. No.: 14/435,333

(22) PCT Filed: Oct. 15, 2012

(86) PCT No.: PCT/JP2012/076631
§ 371 (c)(1),
(2) Date: Apr. 13, 2015

(87) PCT Pub. No.: WO2014/061085
PCT Pub. Date: Apr. 24, 2014

(65) Prior Publication Data
US 2015/0282332 A1 Oct. 1, 2015

(51) Int. Cl.
*B23K 31/02* (2006.01)
*H05K 3/34* (2006.01)
*B23K 35/24* (2006.01)
(Continued)

(52) U.S. Cl.
CPC ............ *H05K 3/3484* (2013.01); *B23K 1/0016* (2013.01); *B23K 35/025* (2013.01); *B23K 35/0244* (2013.01); *B23K 35/24* (2013.01); *B23K 35/26* (2013.01); *B23K 35/262* (2013.01); *B23K 35/264* (2013.01); *B23K 35/40* (2013.01); *C22C 12/00* (2013.01); *C22C 13/02* (2013.01);
(Continued)

(58) Field of Classification Search
None
See application file for complete search history.

(56) References Cited

U.S. PATENT DOCUMENTS 5,320,272 A * 6/1994 Melton ................ B23K 35/007
228/180.21
5,477,419 A * 12/1995 Goodman .............. H05K 3/303
174/263

(Continued)

FOREIGN PATENT DOCUMENTS

JP 08-116169 5/1996
JP 08-252688 10/1996
(Continued)

OTHER PUBLICATIONS

International Search Report, PCT/JP2012/076631, Jan. 8, 2013.

*Primary Examiner* — Kiley Stoner
(74) *Attorney, Agent, or Firm* — Young & Thompson

(57) ABSTRACT

Even if the strength of a solder composition close to a SnBi eutectic composition was improved, it was brittle, so when it was used for small electronic devices such as mobile phones or notebook computers, the resistance to drop impacts when the small electronic equipment was dropped was low. Therefore, interface peeling often took place between the soldered surface and a printed circuit board, resulting in the devices being destroyed. As disclosed, when soldering using a solder paste containing a SnBi-based low-temperature solder, at least one type of solder composition selected from a Sn—Ag, a Sn—Cu, and a Sn—Ag—Cu solder composition is diffused into the solder paste by simultaneously supplying at least one type of preform selected from a Sn—Ag, a Sn—Cu, and a Sn—Ag—Cu solder composition, whereby resistance to drop impacts is improved.

6 Claims, 2 Drawing Sheets

(51) Int. Cl.
*B23K 35/26* (2006.01)
*B23K 35/40* (2006.01)
*B23K 35/02* (2006.01)
*B23K 1/00* (2006.01)
*C22C 12/00* (2006.01)
*C22C 13/02* (2006.01)

(52) U.S. Cl.
CPC .......... *H05K 3/3463* (2013.01); *H05K 2203/04* (2013.01); *H05K 2203/12* (2013.01)

(56) References Cited

U.S. PATENT DOCUMENTS

| | | | | |
|---|---|---|---|---|
| 5,551,627 A * | 9/1996 | Leicht | ................ | B23K 35/001 228/180.22 |
| 6,241,145 B1 | 6/2001 | Maeda et al. | | |
| 2002/0040624 A1* | 4/2002 | Nakamura | ........... | B23K 35/025 75/252 |
| 2003/0089923 A1* | 5/2003 | Oida | .................. | H01L 21/4853 257/200 |
| 2003/0178476 A1* | 9/2003 | Kanai | ............... | B23K 35/0244 228/248.1 |
| 2004/0069974 A1* | 4/2004 | Taguchi | ............... | B23K 35/025 252/500 |
| 2004/0217152 A1* | 11/2004 | Taguchi | ............ | B23K 35/0244 228/248.1 |
| 2007/0090171 A1* | 4/2007 | Ochiai | ................ | B23K 3/0623 228/225 |
| 2007/0172690 A1* | 7/2007 | Kim | .................. | B23K 35/0244 428/646 |
| 2007/0237890 A1* | 10/2007 | Sakai | ...................... | G03F 7/033 427/98.4 |
| 2009/0220812 A1* | 9/2009 | Kato | .................... | B22F 1/0003 428/548 |
| 2009/0269598 A1* | 10/2009 | Ohashi | ................. | B23K 35/025 428/458 |
| 2009/0301606 A1* | 12/2009 | Ueshima | ............ | B23K 35/0244 148/24 |
| 2009/0301607 A1* | 12/2009 | Nakano | .............. | B23K 35/0244 148/24 |
| 2010/0084757 A1* | 4/2010 | Hariharan | .......... | B23K 35/3612 257/690 |
| 2010/0159257 A1* | 6/2010 | Yamaguchi | ........... | B23K 35/025 428/457 |
| 2011/0068151 A1* | 3/2011 | Oh | ........................ | B23K 1/0016 228/119 |
| 2011/0268985 A1* | 11/2011 | Zhang | ................ | B23K 35/0244 428/615 |
| 2012/0018048 A1* | 1/2012 | Yamashita | ........... | B23K 1/0016 148/24 |
| 2012/0088327 A1* | 4/2012 | Brand | ................... | B23K 1/0016 438/72 |
| 2012/0156512 A1* | 6/2012 | Nakano | .................... | B23K 1/00 428/457 |
| 2012/0211549 A1* | 8/2012 | Yamakami | ........... | B22F 1/0014 228/256 |
| 2012/0328361 A1* | 12/2012 | Liu | ......................... | C22C 13/00 403/272 |
| 2014/0036427 A1* | 2/2014 | Taniguro | ................ | B23K 1/203 361/679.01 |
| 2014/0054766 A1* | 2/2014 | Hashino | ............... | H01L 23/49866 257/737 |
| 2014/0079472 A1* | 3/2014 | Oppermann | ......... | B23K 35/262 403/272 |
| 2014/0110153 A1* | 4/2014 | Kashiwagi | ........... | B22F 1/0074 174/251 |
| 2014/0285989 A1* | 9/2014 | Kubota | ................ | H05K 3/3463 361/767 |
| 2015/0049450 A1* | 2/2015 | Okamoto | .......... | H01L 23/49816 361/779 |
| 2015/0116970 A1* | 4/2015 | Kishi | ....................... | H01L 24/16 361/773 |
| 2015/0136461 A1* | 5/2015 | Imamura | .................. | B23K 1/00 174/259 |
| 2015/0183062 A1* | 7/2015 | Imamura | .................. | B23K 1/00 174/257 |
| 2015/0246417 A1* | 9/2015 | Zhang | .................. | B23K 35/025 148/24 |

FOREIGN PATENT DOCUMENTS

| | | |
|---|---|---|
| JP | 2000-307228 | 11/2000 |
| JP | 2004-056065 | 2/2004 |

* cited by examiner

| | BEFORE REFLOW | AFTER REFLOW |
|---|---|---|
| NO PREFORM | | |
| ONE PREFORM (1:1.6) | | |
| TWO PREFORMS (1:3.2) | | |

SOLDERING METHOD USING A LOW-TEMPERATURE SOLDER PASTE

TECHNICAL FIELD

This invention relates to a soldering method for printed circuit boards using a low-temperature solder paste made of a Bi-containing solder and particularly a near-eutectic SnBi solder which is referred to as a low-temperature solder.

BACKGROUND ART

The main circuits of electrical devices such as household electrical appliances, audio devices, and computers are printed circuit boards to which electronic parts are soldered. An age ago, a Sn—Pb solder having a composition of Sn-37 mass % Pb (below, % indicates mass %) was used for soldering of printed circuit boards. However, discarded electrical devices were often buried underground, and Pb dissolved from the discarded printed circuit board and sometimes polluted underground water.

In light of this environmental problem, the use of lead-free solders for printed circuit boards has been increasing for more than 10 years, and today, almost all electrical devices are made using lead-free solder.

Conventionally used Sn—Pb solder has a melting point of 183° C., by which it has the advantage that soldering can be performed at a low operating temperature. If the operating temperature for soldering is low, it is not necessary to be concerned about the heat resistance of electronic parts used in soldering, and it is possible to use electronic parts having low heat resistance such as plastic connectors.

In contrast, the principal lead-free solders currently used are Sn—Ag—Cu based lead-free solders such as Sn-3.0% Ag-0.5% Cu. Sn—Ag—Cu based lead-free solders have the good property that they have greater heat cycle resistance than conventional Sn—Pb solder. However, as their melting temperature is around 220° C. which is roughly 40° C. higher than that of a conventional Sn—Pb solder, electronic parts having low heat resistance could not be used.

When lead-free solders were first developed, because there were many electronic parts which did not have heat resistance, the solder alloys which were developed for use were low-temperature solders such as Sn-58% Bi solder (melting temperature of 139° C.), which had been conventionally used as low-temperature solder, and a solder alloy having increased strength and elongation by adding a small amount of Ag to Sn-58% Bi solder (JP H08-252688 A=Patent Document 1).

However, it was observed that if these Sn—Bi based solder alloys are used with small electronic devices such as mobile phones or notebook computers, when the small electronic devices are dropped, they have low resistance to drop impacts and fracture at the solder bonding interface. Therefore, these solder alloys were not used for such electronic devices.

In order to obtain a solder connection structure having resistance to fatigue, a method which alleviates shear stresses by applying a Sn—Pb solder paste to the bonding surface of a printed circuit board, disposing an In-containing solder ball in contact with the solder paste, and heating the paste and the preform has been disclosed (JP H08-116169 A=Patent Document 2).

Patent Document 1: JP H08-252688 A
Patent Document 2: JP H08-116169 A

DISCLOSURE OF INVENTION

Problem which the Invention is to Solve

Recently, due to a demand for power saving due to stoppage of nuclear power plants and a demand for a reduction in the discharge of $CO_2$, there is a desire to use less electric power in the operation of reflow furnaces. Many low-energy reflow furnaces are being used, but these require a reduction in electric power under the same heating conditions. Accordingly, there was a limit to the decreases in powder consumption that could be achieved.

In addition, there continue to be electronic parts such as semiconductors having low heat resistance which cannot withstand reflow soldering with a lead-free solder. These electronic parts have been subsequently installed using a soldering iron or the like.

In this manner, the use of lead-free solders having a low melting point and referred to as low-temperature solders is being studied as a method which can greatly reduce the electric power consumption of a reflow furnace by lowering the heating conditions of the reflow furnace and which can perform soldering of electronic parts having low heat resistance at the same time as other electronic parts without performing subsequent soldering. A solder composition which is close to a Sn-57% Bi eutectic composition is primarily used as a solder for reflow.

However, even if the strength of a solder composition which is close to a SnBi eutectic solder composition is improved as proposed in Patent Document 1, it is still brittle. Therefore, when it was used in small electronic devices such as mobile phones or notebook computers, the small electronic devices had poor resistance to drop impacts when dropped. As a result, interface peeling often took place between the soldering surface and the printed circuit board and failure took place.

The present invention has been developed in order to deal with such problems.

The problem to be solved by the present invention is to obtain a solder joint having the same resistance to drop impacts as with a SnAgCu solder which is currently used as a lead-free solder even when using a solder paste having a solder composition close to a SnBi eutectic solder composition for soldering printed circuit boards for small electronic devices in order to reduce electric power consumption and to use electronic parts having low heat resistance.

Means for Solving the Problem

The present inventors attempted to use a solder paste having a solder composition close to a SnBi eutectic solder composition for soldering by printing on the lands of a printed circuit board. When a preform having a Sn—Ag, Sn—Cu, or Sn—Ag—Cu solder composition was placed atop the printed solder paste and reflow soldering was carried out, they found that soldering was possible under the same reflow conditions as when using a solder paste alone even though a preform having a Sn—Ag, Sn—Cu, or Sn—Ag—Cu composition was placed on the solder paste, and they completed the present invention.

The present invention is a soldering method in which when soldering using a solder paste of a SnBi-based low-temperature solder, at least one type of preform selected from a Sn—Ag, Sn—Cu, and Sn—Ag—Cu solder composition is simultaneously supplied, thereby allowing at least one solder composition selected from a Sn—Ag, Sn—Cu, and Sn—Ag—Cu solder composition to diffuse into the SnBi-based low-temperature solder in the solder paste.

From in the past, as described in Patent Document 2, it was known to compensate for the drawbacks of solder by use of a blend of different solder compositions. However, the reflow temperature at that time was selected based on the solder alloy having the higher melting point, and it was not thought possible to perform soldering under the same reflow conditions as for a low-temperature solder. As a result, reflow was carried out under higher temperature conditions than for a low-temperature solder, and it was not thought possible to reduce electric power consumption or to use electronic parts having low heat resistance by blending different solder compositions.

If a lead-free preform having the In-10% Ag composition disclosed in Patent Document 2 is used with a solder paste having a solder composition close to a Sn—Bi eutectic solder composition, a Sn—Bi—In eutectic solder composition having a low melting point of 64° C. appears in a solder joint after soldering. Therefore, if a soldered electronic device is left outside or heated, the solder joint may remelt, resulting in malfunction of the electronic device.

The present invention is a soldering method based on an entirely new viewpoint concerning this point. The present invention produces its effect by means of the solder composition of a solder paste, the solder composition of a preform, and the ratio of the solder paste to the preform.

The reasons why the present invention provides good resistance to drop impacts are thought to be as follows.

1. When a solder paste of SnBi solder undergoes reflow soldering to lands of a printed circuit board, Bi in the SnBi solder diffuses throughout the solder and forms a Bi-rich layer (see FIG. 1).

If just a Sn—Bi solder paste is soldered to a printed circuit board, many Bi-rich layers are formed in the solder fillet, so when a force is applied (see the arrow on the left of FIG. 2), cracks are formed in the hard and brittle Bi-rich portions, and the solder fillet is destroyed (see the two arrows on the right of FIG. 2).

2. If a preform having a Sn—Ag, Sn—Cu, or Sn—Ag—Cu composition is added to solder paste at the time of soldering a solder paste to a land of a printed circuit board, the Sn—Ag, Sn—Cu, or Sn—Ag—Cu composition diffuses into the SnBi solder, and a Bi-rich layer is not formed (see FIG. 3).

If a force (see the arrow on the left of FIG. 4) is applied to a soldered portion formed by adding a preform with a Sn—Ag, Sn—Cu, or Sn—Ag—Cu composition to solder paste at the time of soldering a solder paste to a land of a printed circuit board, failure does not occur at the solder fillet portion. Instead, failure occurs at an intermetallic compound layer formed between the solder joint and the land of the printed circuit board (see the two arrows on the right of FIG. 4).

Effects of the Invention

By using a soldering method according to the present invention, even when a solder paste having a solder composition close to a SnBi eutectic solder composition is used for soldering printed circuit boards of small electronic devices in order to reduce electric power consumption and use electronic parts having low heat resistance, it is possible to obtain a solder joint having the same resistance to drop impacts as with a SnAgCu solder, which is currently used as a lead-free solder.

Best Mode for Carrying Out the Invention

A SnBi-based solder paste which is used in the present invention is one formed by mixing a powder of a Sn—Bi solder having a near-eutectic composition or a Sn—Bi—Ag solder in which Ag is added to the Sn—Bi solder as a strengthening element with a flux. The solder of a solder paste used in a soldering method according to the present invention is a powder of a solder having the composition of at least 35% and at most 60% of Bi and a remainder of Sn, or a Sn—Bi—Ag solder powder in which at most 3% of Ag is added to the above composition. More preferably, it is a powder of a solder containing at least 40% and at most 58% of Bi and a remainder of Sn, and the added amount of Ag is preferably at most 1%.

A preform which is added to a solder paste used in the soldering method of the present invention is a preform having a Sn—Ag, Sn—Cu, or Sn—Ag—Cu composition. A preform having a Sn—Ag composition is preferably one having a composition containing at least 0.3% and less than 4.0% of Ag and a remainder of Sn. A preform having a Sn—Cu composition is preferably one having a composition containing at least 0.3% and at most 1.2% of Cu and a remainder of Sn. A preform having a Sn—Ag—Cu composition is preferably one having a composition containing at least 0.3% and at most 4.0% of Ag, at least 0.3% and at most 1.2% of Cu, and a remainder of Sn. More preferably the preform has a composition containing at least 1.0% and at most 3.0% of Ag, at least 0.5% and at most 0.8% of Cu, and a remainder of Sn.

In the present invention, the amounts of Sn, Ag, Cu, and the like which enter the SnBi solder composition vary with the amount of the preform added to the solder paste, as a result of which the resistance to drop impacts after reflow soldering varies. If the amount of a preform which is added in a soldering method according to the present invention is less than 0.7 mass % of the amount of solder paste, the amount of Sn, Ag, Cu, and the like which enter the SnBi solder composition becomes small, and the effect of adding a preform is not obtained. If the amount of a preform which is added exceeds 75% of the amount of solder paste, the melting point of the blended solder becomes too high, it becomes impossible to perform reflow soldering under the same conditions as for a SnBi solder composition, and it becomes impossible to achieve the objects of the present invention, which are to decrease electric power consumption and use electronic parts having low heat resistance.

Accordingly, the amount of a preform which is added to a solder paste according to the present invention is preferably at least 0.7 and at most 75 mass % of the amount of solder paste. More preferably it is at least 0.8 and at most 2.0 mass %.

EXAMPLE 1

Under the conditions shown in Table 1, preforms were placed on lands printed with a SnBi-based solder paste, and reflow soldering was carried out under the usual heating conditions for a SnBi-based solder paste.

After allowing to cool to room temperature, a drop test was carried out, and the number of times until soldered portions broke was measured. The test method for the drop test was as follows.

The test board was a glass epoxy printed circuit board (FR-4) measuring 30×120 mm and having a thickness of 0.8 mm.

In the drop test, both ends of the test board were secured to a special jig with the test board suspended 10 mm above a base. In accordance with JEDEC (Joint Electron Device Engineering Council) specifications, an impact with an acceleration of 1500 G was repeatedly applied. An increase in resistance to at least 1.5 times the initial resistance was viewed as indicating fracture. The number of drops until this level was reached was recorded.

The results are shown in Table 1.

TABLE 1

|  | Reflow temperature | Solder paste | Preform | Result of drop test (number of drops) |
|---|---|---|---|---|
| Example 1 | 180° C. | Sn—58%Bi | Sn—3Ag | 47 |
| Example 2 |  |  | Sn—3Ag—0.5Cu | 42 |
| Example 2 |  |  | Sn—0.7Cu | 48 |
| Comparative Example 3 |  |  | no addition | 3 |
| Comparative Example 4 |  |  | Sn—5Sb | 10 |
| Example 5 | 200° C. | Sn—1Ag—57Bi | Sn—3Ag0.5Cu | 110 |
| Example 6 |  |  | Sn—0.7Cu | 103 |
| Comparative Example 7 |  |  | no addition | 8 |
| Example 8 | 200° C. | Sn—40Bi—1Ag | Sn—3Ag—0.5Cu | 99 |
| Example 9 |  |  | Sn—0.7Cu | 108 |
| Comparative Example 10 |  |  | no addition | 10 |

It can be seen that in the range prescribed by the soldering method according to the present invention, reflow is possible under usual reflow soldering conditions even if a preform having a Sn—Ag, Sn—Cu, or Sn—Ag—Cu composition is added to a SnBi-based low-temperature solder paste.

In addition, it can be seen by comparison of the results of the drop test that addition of a preform having a Sn—Ag, Sn—Cu, or Sn—Ag—Cu composition to a SnBi-based low-temperature solder paste was superior to the case in which a preform having a Sn—Ag, Sn—Cu, or Sn—Ag—Cu composition was not added. Even if a preform is added, no improvement in resistance to drop impacts was achieved when a preform having a Sn-5Sb composition was added.

EXAMPLE 2

A solder paste using a solder powder with a Sn-57Bi-1Ag composition was printed onto copper lands measuring 0.5 mm in diameter formed on a printed circuit board like that shown in FIG. 5. One or two preforms having a Sn-3.0Ag-0.5Cu composition and measuring 0.5 mm×0.25 mm were placed atop each land which had been printed with the solder paste, and reflow soldering was carried out at 200° C., which is the usual heating condition for a solder paste with a Sn-57Bi-1Ag solder composition.

This test ascertained the amount of a preform added to a solder paste of a Sn—Bi composition. With addition of one preform, the ratio of the weight of the solder paste to the weight of the preform was 1:1.6, and with addition of two preforms, it was 1:3.2.

The soldered state after reflow soldering was observed to ascertain whether it was possible to perform soldering under usual reflow conditions for a low-temperature solder.

It was confirmed that with one preform, the solder components of the solder paste and the solder components of the preform were mixed together and could not be distinguished from one another. In contrast, with two preforms, the solder joints became angular indicating that the solder components of the preform did not completely mix.

Figure 1:
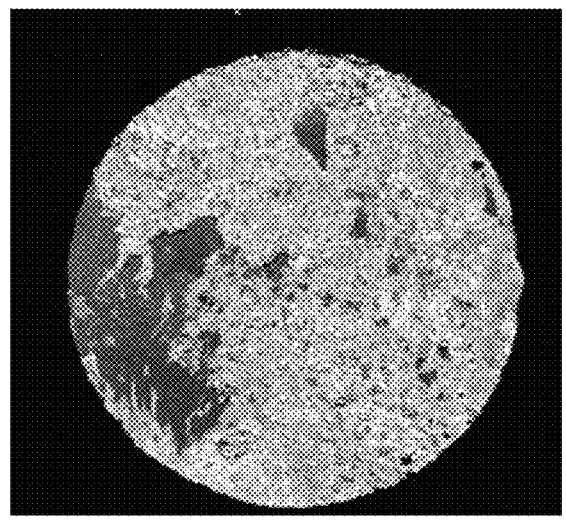
FIG. 1 shows a broken portion of a land which was soldered with just a SnBi solder paste.
Figure 2:
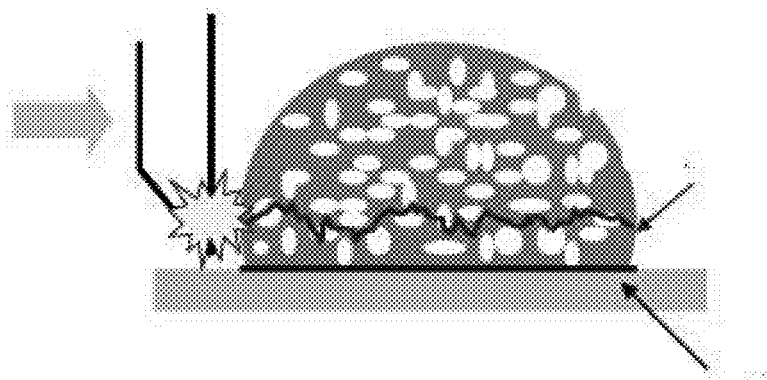
FIG. 2 is a figure showing that a solder joint which was soldered with just a SnBi solder paste broke in the solder portion.
Figure 3:
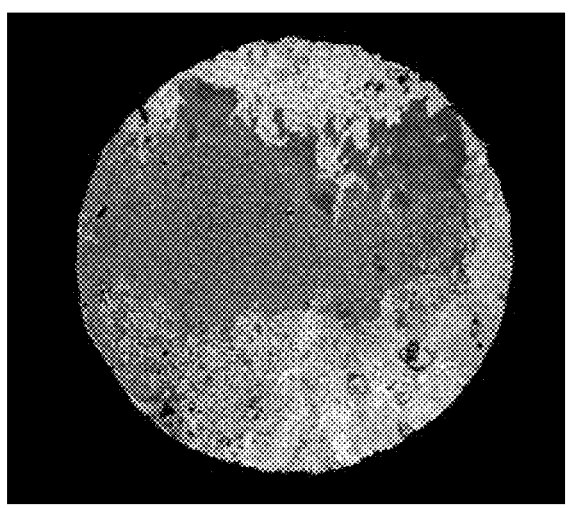
FIG. 3 shows a broken portion of a land which was soldered by a soldering method according to the present invention in which a preform was added to a SnBi solder paste.
Figures 4, 5:
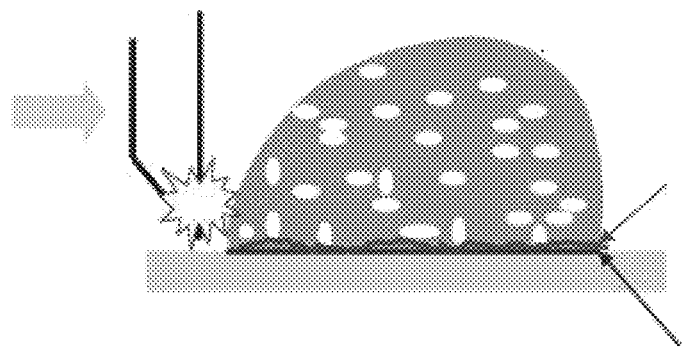
FIG. 4 is a figure showing that a solder joint which was formed by the soldering method according to the present invention in which a preform was added to a SnBi solder paste broke in the land portion.
FIG. 5 is a figure showing the results of a wettability test in Example 2.

EXPLANATION OF SYMBOLS 1. solder; 2. copper land

The invention claimed is:

1. A soldering method using a SnBi-based low-temperature solder paste, wherein at least one type of preform selected from a Sn—Ag, Sn—Cu, and Sn—Ag—Cu solder composition is supplied to atop a printed SnBi-based low-temperature solder paste with the amount of the preform being at least 0.7 to at most 75 mass % of the amount of the solder paste to diffuse at least one solder composition selected from a Sn—Ag, a Sn—Cu, and a Sn—Ag—Cu solder composition into a SnBi-based low-temperature solder.

2. A soldering method using a solder paste as set forth in claim 1, wherein the soldering method using a solder paste made of a SnBi-based low-temperature solder uses a low-temperature solder paste made by mixing a solder powder having a composition of at least 35% and at most 60% of Bi and a remainder of Sn with a flux.

3. A soldering method using a solder paste as set forth in claim 1, wherein the at least one type of preform selected from a Sn—Ag, a Sn—Cu, and a Sn—Ag—Cu solder composition is at least one type of preform selected from a preform having a composition of at least 0.3 to at most 4.0 mass % of Ag and a remainder of Sn, a preform having a composition of at least 0.3 to at most 1.2 mass % of Cu and a remainder of Sn, and a preform having a composition of at least 0.3 to at most 4.0 mass % of Ag, at least 0.3 to at most 1.2 mass % of Cu, and a remainder of Sn.

4. A soldering method using a solder paste as set forth in claim 1, wherein the soldering method using a solder paste made of a SnBi-based low-temperature solder uses a low-temperature solder paste made by mixing a solder powder having a composition of at least 35% and at most 60% of Bi, at most 3% of Ag, and a remainder of Sn with a flux.

5. A soldering method using a solder paste as set forth in claim 1, wherein the at least one type of preform selected from a Sn—Ag, Sn—Cu, and Sn—Ag—Cu solder composition is at least one type of preform selected from a preform having a composition of at least 0.3 to at most 4.0 mass % of Ag and a remainder of Sn, a preform having a composition of at least 0.3 to at most 1.2 mass % of Cu and a remainder of Sn, and a preform having a composition of at least 0.3 to at most 4.0 mass % of Ag, at least 0.3 to at most 1.2 mass % of Cu, and a remainder of Sn, and the solder paste is a low-temperature solder paste formed by mixing solder powder with a composition of at least 35% and at most 60% of Bi and a remainder of Sn with a flux.

6. A soldering method for a solder paste as set forth in claim 1, wherein the at least one type of preform selected from a Sn—Ag, Sn—Cu, and Sn—Ag—Cu solder composition is at least one type of preform selected from a preform having a composition of at least 0.3 to at most 4.0 mass % of Ag and a remainder of Sn, a preform having a composition of at least 0.3 to at most 1.2 mass % of Cu and a remainder of Sn, and a preform having a composition of at least 0.3 to at most 4.0 mass % of Ag, at least 0.3 to at most 1.2 mass % of Cu, and a remainder of Sn, and the solder paste is a low-temperature solder paste formed by mixing solder powder with a composition of at least 35% and at most 60% of Bi, at most 3% of Ag, and a remainder of Sn with a flux.

* * * * *